(12) United States Patent
Iroaga

(10) Patent No.: US 7,061,307 B2
(45) Date of Patent: Jun. 13, 2006

(54) CURRENT MIRROR COMPENSATION CIRCUIT AND METHOD

(75) Inventor: Echere Iroaga, Stanford, CA (US)

(73) Assignee: Teradyne, Inc., Boston, MA (US)

( * ) Notice: Subject to any disclaimer, the term of this patent is extended or adjusted under 35 U.S.C. 154(b) by 0 days.

(21) Appl. No.: 10/671,755

(22) Filed: Sep. 26, 2003

(65) Prior Publication Data

US 2005/0068076 A1    Mar. 31, 2005

(51) Int. Cl.
*G05F 1/10*    (2006.01)

(52) U.S. Cl. .................. 327/541; 327/543; 330/288; 323/315

(58) Field of Classification Search ............... 327/530, 327/538–541, 543; 330/288; 323/315, 316
See application file for complete search history.

(56) References Cited

U.S. PATENT DOCUMENTS

| | | | | |
|---|---|---|---|---|
| 4,990,864 | A * | 2/1991 | Kwan ........................ 330/288 |
| 5,045,772 | A * | 9/1991 | Nishiwaki et al. .......... 323/313 |
| 5,675,280 | A * | 10/1997 | Nomura et al. ............. 327/538 |
| 5,691,658 | A * | 11/1997 | Klein ......................... 327/104 |
| 5,873,053 | A * | 2/1999 | Pricer et al. ................ 702/130 |
| 5,939,933 | A * | 8/1999 | Wang ......................... 327/512 |
| 6,023,185 | A * | 2/2000 | Galipeau et al. ............ 327/513 |
| 6,051,999 | A | 4/2000 | To et al. ....................... 327/66 |
| 6,066,944 | A | 5/2000 | Sakurai ...................... 323/315 |
| 6,133,749 | A * | 10/2000 | Hansen et al. ................ 326/30 |
| 6,201,435 | B1 * | 3/2001 | Chou .......................... 327/543 |
| 6,323,695 | B1 | 11/2001 | Heinrich ....................... 327/89 |
| 6,448,811 | B1 * | 9/2002 | Narendra et al. ............. 326/82 |
| 6,459,326 | B1 * | 10/2002 | Descombes ................. 327/513 |
| 6,462,527 | B1 * | 10/2002 | Maneatis .................... 323/315 |
| 6,472,921 | B1 | 10/2002 | Rao et al. .................... 327/237 |
| 6,737,909 | B1 * | 5/2004 | Jaussi et al. ................ 327/541 |
| 6,850,049 | B1 * | 2/2005 | Kono .......................... 323/315 |
| 6,914,457 | B1 * | 7/2005 | Confalonieri et al. ....... 327/108 |
| 2004/0061527 | A1 | 4/2004 | Knee ............................ 326/83 |

FOREIGN PATENT DOCUMENTS

EP    0239989    3/1987
EP    1187331    9/2000

OTHER PUBLICATIONS

English Abstract of EP 1187331.

* cited by examiner

*Primary Examiner*—Kenneth B. Wells

(57) ABSTRACT

A current compensation circuit for use with a current mirror is disclosed. The current mirror circuit has a current path defined by a first current mirror stage driving a second current mirror stage, the second current mirror stage is coupled to a supply voltage source. The current compensation circuit comprises an impedance divider coupled to the supply voltage and an output node. The impedance divider operates to generate a compensation signal at the node representative of voltage changes in the supply voltage source. The compensation circuit further includes a gain stage having an input coupled to the output node and a current output connected to the current path. The gain stage operates to generate a compensation current for application to the current path in response to the compensation signal.

12 Claims, 4 Drawing Sheets

CURRENT MIRROR COMPENSATION CIRCUIT AND METHOD

TECHNICAL FIELD

The circuitry described herein relates generally to automatic test equipment, and more particularly low jitter timing generation circuits for automatic test equipment applications.

BACKGROUND

Timing edge placement is often a critical parameter for high performance semiconductor testers. Having the ability to place the rising and/or falling edge of a test signal within a few picoseconds of a desired point in time may mean the difference in passing or failing large numbers of semiconductor devices under test.

Conventional timing generators that produce high accuracy timing signals are often employed in CMOS integrated circuits. CMOS technology provides relatively good performance at very low cost. However, CMOS ICs are often susceptible to temperature and other conditions that affect the performance of the circuit. To counter this, many CMOS timing generators employ sophisticated compensation techniques to minimize changes in delay.

With reference to FIG. 1, a conventional CMOS timing generator 10 that provides for temperature compensation typically includes a plurality of delay elements D1–DN coupled together to form a delay line. Each of the delay element outputs serve as timing selection inputs to a timing signal selector (not shown). The same outputs are also used for a delay compensation scheme. A compensation multiplexer 12 is employed, that receives the delay outputs, and provides an output to a phase detector 14, where it is compared to a reference signal Vref to determine any phase difference. A compensation voltage is then generated in response to the magnitude of any phase difference, and fed to a charge pump or voltage-to-current converter 16. The current generated by the converter is provided as a reference bias current to a bias current fanout circuit 18 that duplicates and distributes bias current to the delay elements to control the delay.

To fanout, or distribute the bias current to the various delay elements, a current mirror circuit scheme is typically employed. As shown in FIG. 2, a conventional current mirror includes a reference current source 19 coupled to a current source transistor Qs to generate the same current through a first mirror transistor $Q_{FM1}$. The mirror transistor's gate is tied to its drain, with its source terminal coupled to the supply voltage $V_{DD}$. A plurality of mirroring transistors $Q_{FM2}$–$Q_{FMN}$ are disposed in parallel, each with its gate tied to the first mirror transistor gate, and source terminals tied to $V_{DD}$.

While this configuration works well for its intended applications, the current through each mirror transistor may be susceptible to noise components acting on the $V_{DD}$ bus. Even a relatively small change of 100 millivolts can cause a corresponding change in the bias current through each mirror, correspondingly affecting the level of current provided therefrom. As voltage levels on integrated circuits continue to decrease, this problem becomes more pronounced.

What is needed and currently unavailable is a compensation circuit for use with current mirror circuits to minimize changes in current attributable to supply voltage noise. The current mirror compensation circuit described herein satisfies this need.

SUMMARY

The current mirror compensation circuit described herein provides a low-jitter solution for the generation of bias currents by one or more current mirrors. By minimizing the errors attributable to noise in the supply voltage, reduced supply voltage levels may be employed in integrated circuits with little error caused by the current mirror circuitry.

To realize the foregoing advantages, the circuit in one form comprises a current compensation circuit for use with a current mirror. The current mirror circuit has a current path defined by a first current mirror stage driving a second current mirror stage, the second current mirror stage is coupled to a supply voltage source. The current compensation circuit comprises an impedance divider coupled to the supply voltage and an output node. The impedance divider operates to generate a compensation signal at the node representative of voltage changes in the supply voltage source. The compensation circuit further includes a gain stage having an input coupled to the output node and a current output connected to the current path. The gain stage operates to generate a compensation current for application to the current path in response to the compensation signal.

In another form, the circuit comprises a timing generator for use in a semiconductor tester. The timing generator includes a delay line having a plurality of delay cells with respective phase-shifted outputs and bias current inputs. A selector with a plurality of inputs receives the phase shifted outputs, and includes an output. Phase detection circuitry detects the phase shift between the selector output and a reference signal, and generates bias current. The timing generator further includes means for distributing the bias current to the plurality of delay cells.

Other features and advantages of the present invention will be apparent from the following detailed description when read in conjunction with the accompanying drawings.

BRIEF DESCRIPTION OF THE DRAWINGS

The circuit described herein will be better understood by reference to the following more detailed description and accompanying drawings in which.

DETAILED DESCRIPTION

The current mirror compensation circuit described herein, generally designated 50, provides a unique solution for addressing the undesirable effects of a changing supply voltage in high performance CMOS timing generators. This is accomplished by feeding compensation current to bias current generated by fanout circuitry 30. The compensation current offsets any changes to the bias current resulting from any changes in $V_{DD}$ caused by noise or jitter. By minimizing the effects of a changing $V_{DD}$, changes to the delay characteristics of the cell are also correspondingly minimized.

Figure 1:
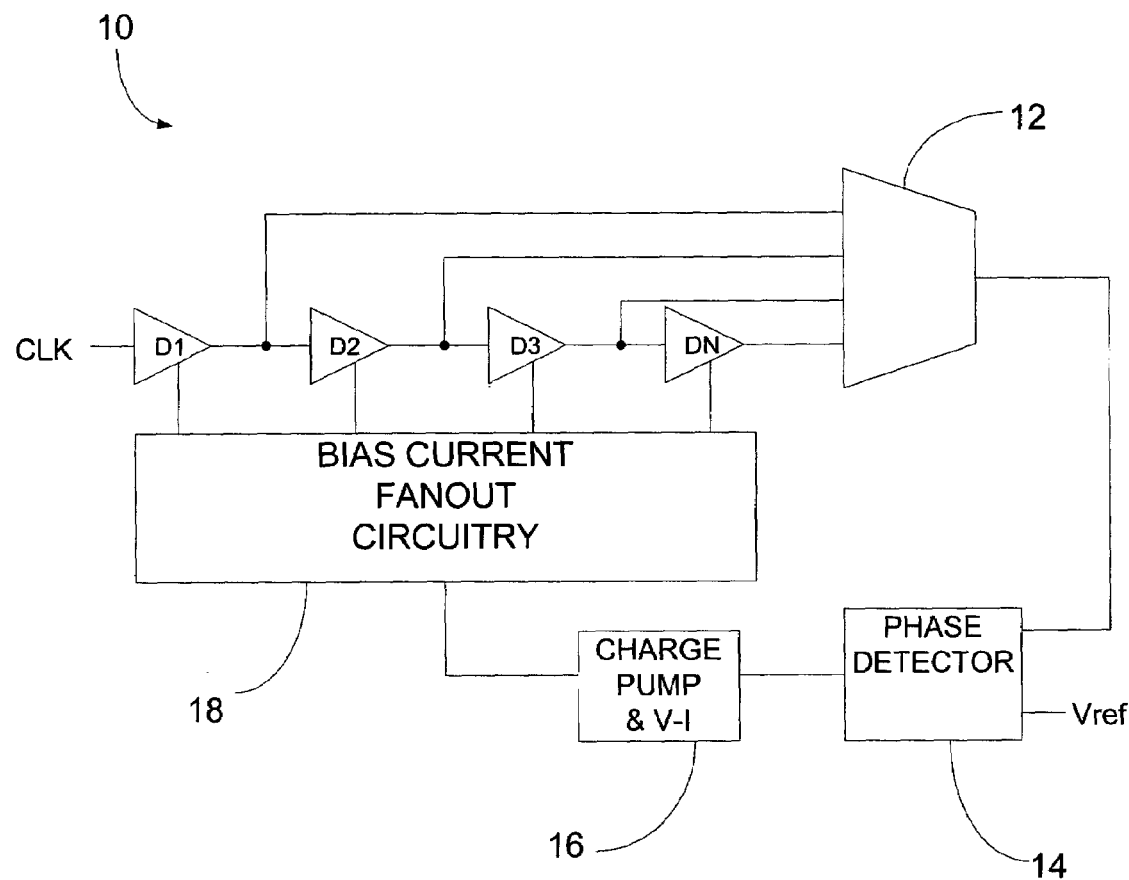
FIG. 1 is a high-level block diagram of a conventional timing generator.
Figure 2:
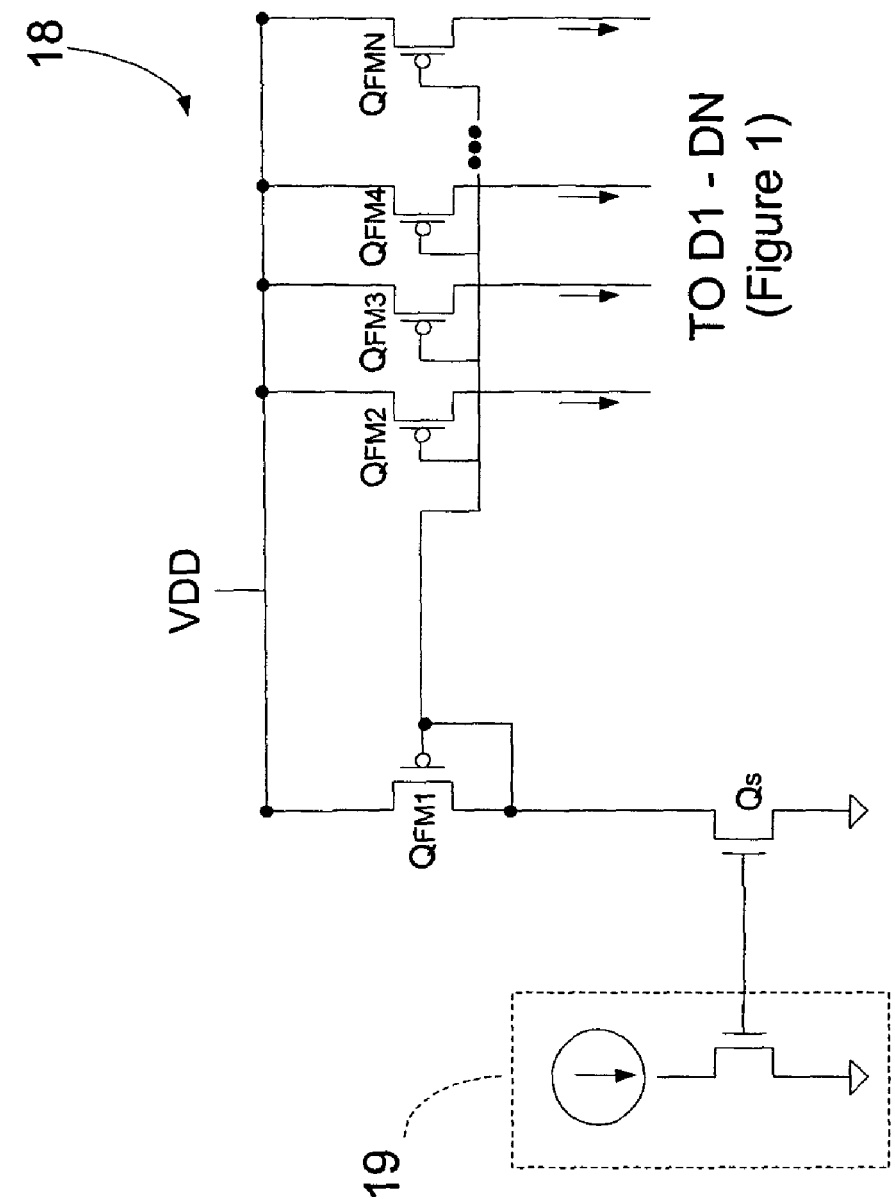
FIG. 2 is a partial schematic view of the conventional bias current fanout circuitry employed in the timing generator of FIG. 1.
Figure 3:
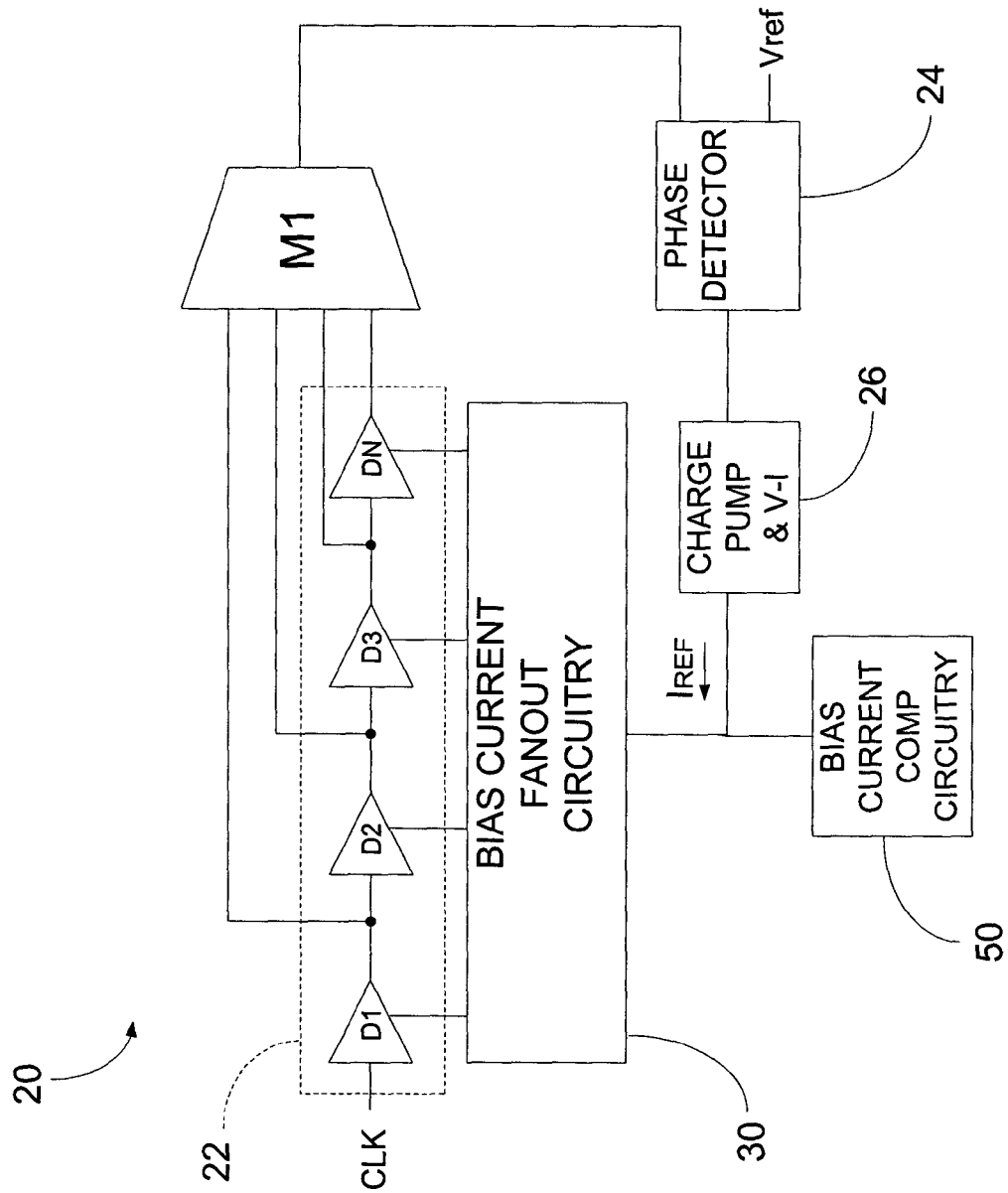
FIG. 3 is a high-level block diagram of a timing generator according to one form of the circuit described herein.

Referring now to FIG. 3, a timing generator that employs the current mirror compensation circuit, generally designated 20, is shown. The timing generator is of the type that provides bias current compensation to control delay. The generator includes a delay line 22 comprising a set of N delay elements D1–DN, each providing a proportional to 1/N phase offset with respect to an input clock CLK. A preferred delay element construction that provides low jitter delay is described in co-pending patent application Ser. No. 10/376,664, titled "Low Jitter Delay Cell", filed Feb. 28, 2003, assigned to the assignee of the present invention, and expressly incorporated by reference herein.

Further referring to FIG. 3, the delay element outputs are fed to a selector, or multiplexer M1. The multiplexer output feeds a phase detector 24 that determines the phase difference between the selected delay signal (presented by the multiplexer) and a reference signal Vref. A charge pump and voltage-to-current converter 26 receives a difference signal from the phase detector to generate a reference bias current $I_{REF}$. The reference bias current is then duplicated and distributed by fanout circuitry 30 to provide the bias current for the delay elements. The change in bias current serves to control the delay through each element to a desired level.

Figure 4:
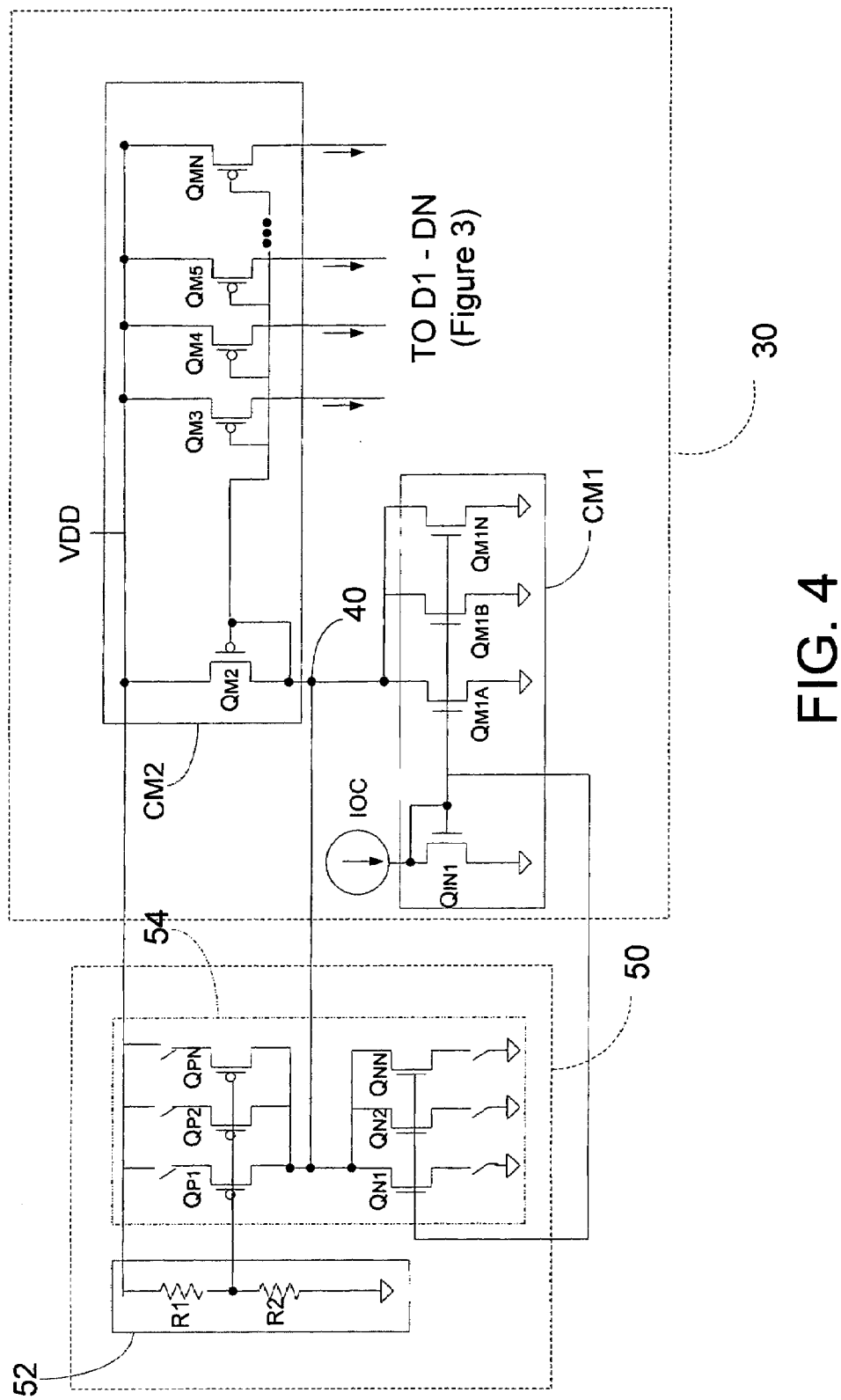
FIG. 4 is a high-level block diagram of a bias current source for use in the timing generator of FIG. 3.

Referring now to FIG. 4, the fanout circuitry 30 includes a current mirror CM1. CM1 includes a reference current source input transistor QIN1 that receives an off-chip current IOC to generate a bias voltage CM1 also includes, in the form of a current DAC, transistors QM1A–QM1N. As is well understood in the art, the current DAC comprises a bank of transistors that are selectively activated to achieve desired characteristics.

With continued reference to FIG. 4, Transistors QM1A–QM1N are disposed in series with a second current mirror CM2 comprising transistor QM2, forming a node with QM2 at 40. While not explicitly shown in FIG. 4, the voltage-to-current converter output (FIG. 3) is connected to node 40. The second current mirror transistor QM2, in turn, has its gate tied to the gates of an array of mirror transistors QM3–QMN. Because of the respective gate-to-source connections for each transistor, the current through QM2 is duplicated en masse through transistors QM3–QMN. The duplicated currents are then fed as bias currents to the delay cells, or groups of delay cells.

For optimum control over the bias current, and to minimize the effects from undesirable changes on the supply voltage VDD, the fanout circuitry 30 includes an input, at node 40, for receiving compensation current from the current mirror compensation circuit 50.

Referring again to FIG. 4, the current mirror compensation circuit 50 comprises an impedance divider 52 and a programmable common source gain stage 54. The impedance divider is preferably in the form of a voltage divider with a pair of series-connected resistors R1 and R2. In the overall preferred implementation wherein the entire fanout and compensation circuitry is disposed on a single CMOS integrated circuit, the resistors take the form of diode-connected MOSFET transistors having channel configurations corresponding to desired resistances of approximately one to two kohms. The resistors form a path from the supply voltage source $V_{DD}$, at one end, to the return voltage rail, or ground, at the other end. An output node disposed at the junction between R1 and R2 provides a reduced-voltage output for application to the programmable current source 54.

The programmable common source gain stage 54 comprises a parallel array of P-channel MOS transistors $Q_{P1}$–$Q_{PN}$ that are programmable to enable a varying range of current gain in response to a range of detected voltages at the divider output node. In other words, the range of available current in response to a sensed voltage from the divider may be increased or decreased depending on how many transistors from the array are activated.

To provide a programmable bias current for the common source gain stage 54 over the compensation current, an array of n-channel transistors $Q_{N1}$–$Q_{NN}$ are coupled to the p-channel array. Each gate terminal of the n-channel array is tied to the first current mirror CM1. Like the p-channel array, the n-channel transistors may be programmably activated as necessary to generate the desired bias current. The output of the programmable gain stage 54 feeds the fanout circuitry input at node 40.

In operation, the accuracy of the timing generator 20 (FIG. 3) depends upon the accuracy of the individual delays associated with each delay cell DN. The individual delays are each regulated by the bias current running through each cell DN. Bias current is drawn through each cell and is programmed by the user to achieve the desired delay for the cell. Generally, a higher bias current results in a shorter delay, while a lower bias current increases the delay. The bias voltage for the cell is provided by the $V_{DD}$ bus, generally on the order of 1.2 volts. However, noise often affects the value of $V_{DD}$, sometimes increasing or decreasing the level by +/−0.10 volts.

Where a noisy $V_{DD}$ affects the bias current produced by the fanout circuitry 30, the compensation current circuit 50 offsets the effect by sinking or sourcing appropriate levels of current into the input node 40 (FIG. 4). In the instance where too much current is being drawn through the second current mirror CM2 because of a noisy $V_{DD}$, additional current is supplied into the node 40 from the compensation circuit 50, causing transistor $Q_{M2}$ to supply correspondingly less current, while the first current mirror CM1 (transistor $Q_{M1}$) still draws its required current. In the instance where too little current is drawn through transistor $Q_{M2}$, the compensation circuit sinks current, forcing $Q_{M2}$ to provide additional current, which is duplicated through mirror transistors $Q_{M3}$–$Q_{MN}$. The programmability aspect of the current mirror compensation circuit allows for fine tuning the compensation current, as necessary.

Those skilled in the art will appreciate the benefits and advantages afforded by the circuit described herein. Of significant importance is the current compensation feature that offsets bias current inaccuracies caused by undesirable noise acting on the supply voltage. Further, the programmable nature of the circuit provides flexibility and accuracy in allowing for fine-tuning of the compensation current. Moreover, due to the circuit's convenient construction, it is readily adaptable for use as a standard cell block.

It will also be appreciated that the current mirror compensation circuit described herein is not limited solely to the field of automatic test equipment (ATE). While ATE presents a challenging environment where such a circuit provides a substantial beneficial impact, any application where current mirroring techniques are employed may benefit from the use of this circuit. For example, circuits that employ analog-to-digital conversion techniques or where current generates a reference voltage may use the compensation circuit. These applications are likely to use current mirroring techniques with reduced supply voltages.

While the invention has been particularly shown and described with reference to the preferred embodiments thereof, it will be understood by those skilled in the art that various changes in form and detail may be made therein without departing from the spirit and scope of the invention.

What is claimed is:

1. A current compensation circuit comprising:
    an impedance divider being directly coupled to a supply voltage source of a current mirror circuit and having an output node, the impedance divider being configured to generate a compensation signal at the output node representative of voltage changes in the supply voltage source; and
    a gain stage having a stage input coupled to the output node and a stage output connected to a node of the current mirror circuit, the gain stage being configured to generate a compensation current from the stage output for application to the node of the current mirror circuit in response to the compensation signal, the gain stage being directly coupled to the high and low potentials of the supply voltage source and comprising a first parallel array of programmable transistors for defining a predetermined range of the compensation current.

2. The current compensation circuit of claim 1 wherein the first parallel array of programmable transistors comprises p-channel transistors.

3. The current compensation circuit of claim 2 wherein the gain stage further comprises a second parallel array of programmable transistors to cooperate with the first parallel array of transistors for defining a predetermined gain characteristic for the compensation current.

4. The current compensation circuit of claim 1 wherein the impedance divider comprises at least two impedance elements coupled in series between the supply voltage source and a return voltage source.

5. The current compensation circuit of claim 1 wherein the current compensation circuit is formed on a complementary metal oxide semiconductor (CMOS) device.

6. The current compensation circuit of claim 5 wherein the first parallel array of programmable transistors comprises a first array of p-channel transistors.

7. The current compensation circuit of claim 3 wherein the second parallel array of programmable transistors comprises n-channel transistors.

8. A current compensation circuit comprising:
    an impedance divider being directly coupled to a supply voltage source of a current mirror circuit and having an output node, the impedance divider operative to generate a compensation signal at the output node representative of voltage changes in the supply voltage source; and
    a gain stage having an input coupled to the output node and a current output connected to a node of the current mirror circuit, the gain stage being directly coupled to the high and low potentials of the supply voltage and operative to generate a compensation current for application to the node of the current mirror circuit in response to the compensation signal,
    wherein the current compensation circuit is formed on a single complementary metal oxide semiconductor (CMOS) device comprising a first array of p-channel transistors and a second array of n-channel transistors.

9. The current compensation circuit of claim 8 wherein the gain stage comprises a first parallel array of programmable transistors.

10. The current compensation circuit of claim 9 wherein the first parallel array of programmable transistors comprises the first array of p-channel transistors.

11. The current compensation circuit of claim 10 wherein the gain stage further comprises a second parallel array of programmable transistors to cooperate with the first parallel array of transistors for defining a predetermined gain characteristic for the compensation current.

12. The current compensation circuit of claim 11 wherein the second parallel array of programmable transistors comprises the second array of n-channel transistors.

* * * * *